United States Patent [19]

Mamiya et al.

[11] Patent Number: 4,677,530
[45] Date of Patent: Jun. 30, 1987

[54] PRINTED CIRCUIT BOARD AND ELECTRIC CIRCUIT ASSEMBLY

[75] Inventors: Toshiharu Mamiya, Kanagawa; Hiroyuki Wakasa, Tokyo, both of Japan

[73] Assignee: Canon Kabushiki Kaisha

[21] Appl. No.: 782,179

[22] Filed: Sep. 30, 1985

Related U.S. Application Data

[63] Continuation of Ser. No. 510,337, Jul. 1, 1983, abandoned.

[30] Foreign Application Priority Data

Jul. 8, 1982 [JP] Japan ................................ 57-119493

[51] Int. Cl.⁴ .............................................. H05K 1/11
[52] U.S. Cl. .................................... 361/414; 361/412; 361/413
[58] Field of Search ........................ 361/412, 413, 414

[56] References Cited

U.S. PATENT DOCUMENTS

| | | | |
|---|---|---|---|
| 3,107,414 | 10/1963 | Sterling | 29/849 X |
| 3,335,489 | 8/1967 | Grant | 174/68.5 X |
| 3,541,223 | 11/1970 | Helms | 174/68.5 X |
| 3,795,047 | 3/1974 | Abolafia et al. | 361/412 X |
| 3,863,261 | 1/1975 | Klein | 361/415 X |
| 3,875,479 | 4/1975 | Jaggar | 361/406 |
| 3,911,234 | 10/1975 | Kotaka | 174/68.5 X |

Primary Examiner—R. R. Kucia
Attorney, Agent, or Firm—Toren, McGeady & Associates

[57] ABSTRACT

In a printed circuit board having land parts provided for connecting electric circuit forming elements and conductors interconnecting the elements. The conductors interconnect the land parts without the use of intercrossed connection wires over the conductors between the land parts.

1 Claim, 9 Drawing Figures

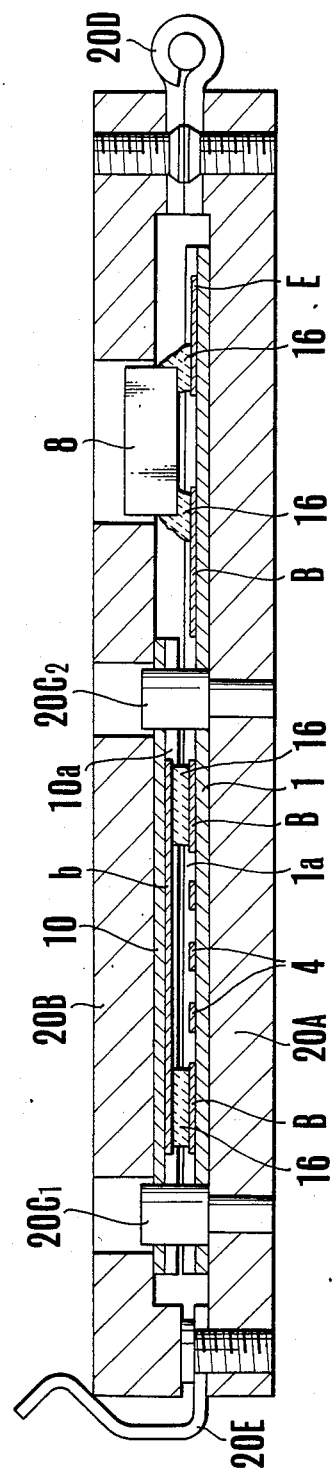

4,677,530

PRINTED CIRCUIT BOARD AND ELECTRIC CIRCUIT ASSEMBLY

This is a continuation of application Ser. No. 510,337, filed July 1, 1983 now abandoned.

BACKGROUND OF THE INVENTION

1. Field of the Invention

This invention relates to a printed circuit board and a structural arrangement of an electric circuit assembly which has circuit forming elements such as resistors, capacitors, transistors, IC's, etc. disposed on the printed circuit board and which is interconnected by means of conductors, such as a copper foil pattern, to form an electic circuit.

2. Description of the Prior Art

There have been proposed numerous printed circuit boards of the type having conductors on a substrate with land parts provided in necessary parts of the conductors for soldering the circuit elements thereto. The prior art relative to these printed circuit boards includes a method for preventing a conductor on a printed circuit board from short-circuiting, as disclosed in U.S. Pat. Nos. 4,088,824 and 3,433,888, and a method in which conductors are disposed both on the front and reverse surfaces of a printed ciruit board and which have electrical continuity between them as disclosed in U.S. Pat. No. 3,610,811. Meanwhile, in designing a printed circuit board, it is important to appropriately dispose circuit connection wires which three-dimensionally intercross on the electric circuit.

Circuit wires are never allowed to three-dimensionally intercross on a single pattern surface of a printed circuit. While each pattern is thus arranged to have no three-dimensional intercrossing of circuit connection wires, it is inevitable that some wires three-dimensionally intercross. This will be understood, for example, from a printed circuit board 1 shown in FIG. 1 of the accompanying drawings. The circuit board 1 comprises an IC (integrated circuit); land parts A1-A2, B1-B2 C1-C2, . . . which are provided for soldering thereto the lead wires of electric circuit elements; and a conductor pattern 4 which interconnects the land parts or connects with circuit parts which are not shown. In the circuit of FIG. 1, some of the land parts A1 and A2; B1 and B2; C1 and C2; . . . indicated by the same alphabetical reference symbols, sometimes must be interconnected with each other. In one of the methods for interconnection between the land parts, through holes A1, B1, C1, . . . arranged as shown in FIG. 2, a conductor is provided on the reverse side of a double-side printed circuit board. There are also formed the same lands A1-A2, B1-B2, C1-C2, . . . on the reverse side to that which is formed with a conductor, as shown in FIG. 1. On the reverse side, the lands to be interconnected are also connected by the conductor. The front and reverse sides are connected to each other by holes which are provided in the middle of these lands. The printed circuit board must be arranged on both sides using the through holes. However, the circuit wires to be intercrossed do not exist all over the reverse side. Thus, there inevitably is a considerably large wasteful portion on the reverse side. The double-side printed circuit board and the through holes themselves also cause an increase in cost. In many cases, the printed circuit boards used for office equipment and precision apparatus are flexible printed circuit boards (hereinafter called FPC). Compared with a single-side FPC, the cost of a double-side FPC is about twice as high as the former. Furthermore, since the FPC is used in a bent state, it is not readily bendable when conductors are applied to both the front and reverse sides thereof. Another method for connecting conductors is shown in FIG. 3. Referring to FIG. 3, there are wires $6_1$-$6_6$ which are called jumper wires. The jumper wires $6_1$, $6_3$, $6_4$ and $6_6$ are open wires while the jumper wires $6_2$ and $6_5$ are covered wires. These wires are designed for interconnecting two points. Therefore, where three points are to be interconnected, as shown by reference symbols B and C, points B' and C' must be added as shown in FIG. 3. The covered wires $6_2$ and $6_5$ are used to avoid a short-circuit which would occur between uncovered wires if they are connected. It is now possible to automatically solder elements and open wires by such soldering means as the reflow soldering method using chip type elements. However, the automatic soldering process is not applicable to these covered wires. Furthermore, the reliability of soldering degrades if the length of these jumper wires is either longer or shorter than a specified length. If the open wires have some metal members located closely, a short-circuit tends to occur. Meanwhile, the covered wires which are soft and have no fixed positions tend to hinder a moving member, if such is located nearby. A short jumper wire may be replaced with a device called a chip jumper which is indicated by a reference numeral 7 in FIG. 4. The chip jumper gives greater soldering reliability than a short jumper wire. However, the use of chip jumpers necessitates an increase in the size of lands. Besides, the number of circuit wires that can be jumped by the chip jumper is limited. In view of these shortcomings, the present invention is directed to providing a method in which use of jumper wires is replaced by the use of an FPC which gives high soldering reliability and ensures safe connection of patterns with reduced probability of a short-circuit or impeded contact with other members.

It is therefore an object of the invention to provide a printed circuit board which permits interconnection between land parts or conductors without intercrossing connection wires.

It is another object of the invention to provide an electric circuit assembly wherein two printed circuit boards are laminated into a package with land parts or conductors interconnected by a novel method which differs from the prior art connecting method.

It is another object of the invention to provide a printed circuit board or an electric circuit assembly which can be manufactured at a low cost and which has a reliable, simple structural arrangement.

It is still another object of the invention to provide an electric circuit assembly which consists of two laminated printed circuit boards and which fcilitates carrying out a test or check-up operation by connecting the circuit assembly to another circuit via a connector after completion of the assembly work thereon.

These and further objects and features of the invention will become apparent from the following detailed description of preferred embodiments thereof taken in conjunction with the accompanying drawings.

SUMMARY OF THE INVENTION

The object of the invention may be obtained in an electric circuit assembly having a first printed circuit board having land parts arranged to connect electric circuit forming elements and conductors arranged to interconnect the land parts. The land parts of the first circuit board include at least a pair of land parts which must be electrically connected to each other. The apparatus also includes a second printed circuit board having at least a pair of land parts and conductors for interconnecting the land parts.

Electrical connection between the first and second circuit boards is arranged to be effected by superimposing on each other the land parts of the first and second printed circuit boards or the conductors of the first and second printed circuit boards.

BRIEF DESCRIPTION OF THE DRAWINGS

FIG. 6 is a sectional view showing an apparatus for superimposing printed circuit boards on each other according to the above embodiment of the invention.

DETAILED DESCRIPTION OF THE PREFERRED EMBODIMENTS

Figure 1:
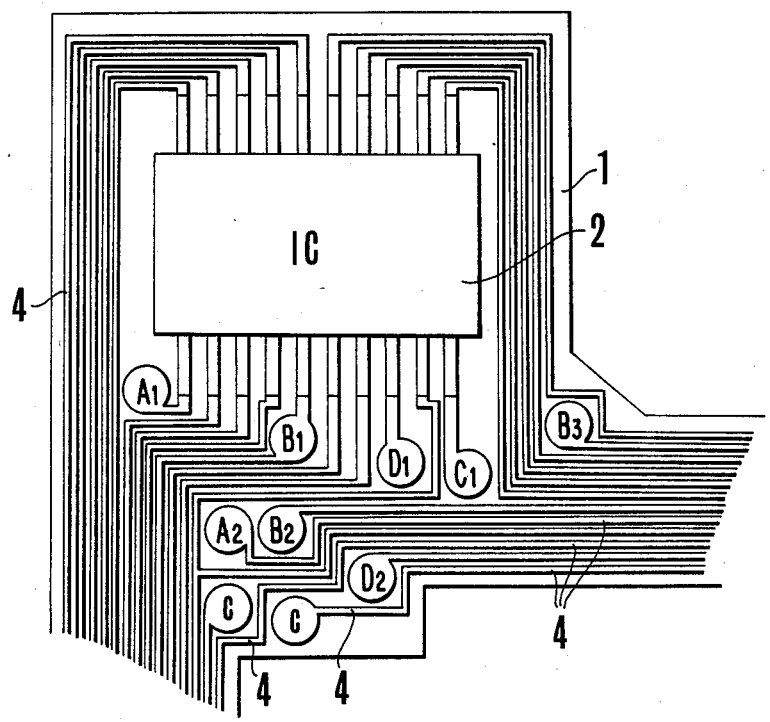
FIG. 1 is a plan view showing the structural arrangement of a printed circuit board.
Figure 2:
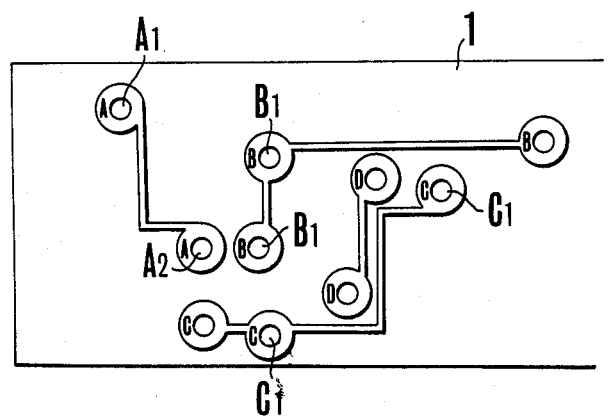
FIG. 2 is a perspective view showing the conductive parts on the back side of the printed circuit board of FIG. 1 using through holes.
Figure 3:
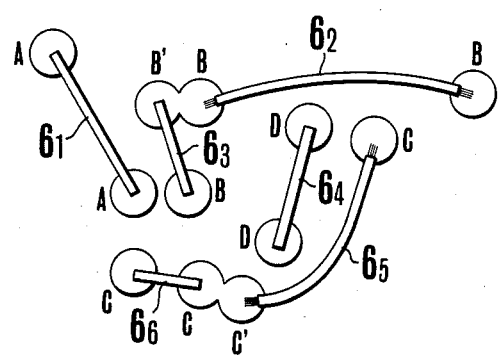
FIGS. 3 and 4 are schematic views showing the arrangements of prior art methods.
Figure 4:
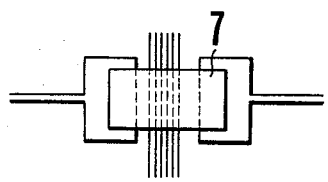
Figure 5:
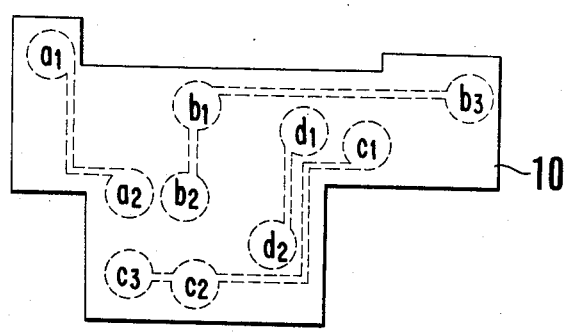
FIG. 5 is a plan view showing a printed circuit board in accordance with an embodiment of the present invention.

A printed circuit board 1 which is arranged as shown in FIG. 1, is employed as one of the printed circuit boards 1, 10 in an embodiment of the present invention. The second printed circuit board 10, used in the embodiment, is arranged as shown in FIG. 5. Referring to FIG. 5, on the printed circuit board 10 are printed land parts a1-a2, b1-b2, c1-c2, . . . and conductors which interconnect land parts a—a, b—b—b, c—c—c, . . . . The land parts a1-a2, b1-b2, c1-c2, . . . on the second printed circuit board 10 are in positions corresponding to the positions of the land parts A1-A2, B1-B2, C1-C2, . . . of the first printed circuit board 1 shown in FIG. 1.

In accordance with the connecting method of the present invention, the first printed circuit board 1, which is shown in FIG. 1, is connected to the second printed circuit board 10, shown in FIG. 5, at these corresponding land parts A1 and a1, B1 and b1, C1 and c1, . . . respectively. As an example of a method for effecting this connection, a jig arrangement is used as shown in FIG. 6.

In FIG. 6, the reference numeral 1 identifies the first printed circuit board. The land parts B, B and B are interconnected by conductors which are not shown. An electric circuit element 8 is positioned on the first printed circuit board 1 between the land parts B and E by means of a paste-like solder 16.

The jig arrangement included jigs 20A and 20B. The first printed circuit board 1 is first placed on the jig 20A. The paste-like solder 16 is applied to the land part B which is to be connected. Then, the second printed circuit board 10 is superimposed on the first circuit board 1 with the lands of one circuit board 1, 10 aligned with the corresponding lands of the other 1, 10.

Figure 7:
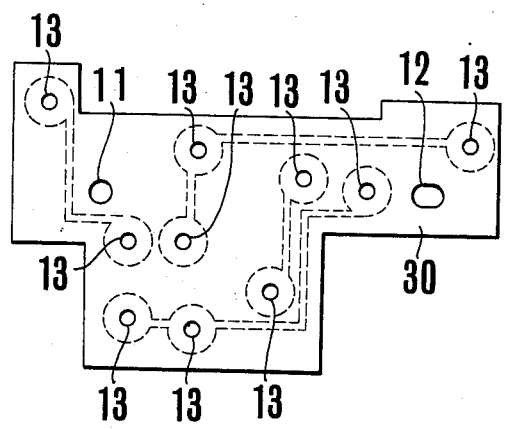
FIG. 7 is a plan view showing a printed circuit board which is provided with positioning holes.

In that situation, as shown in FIG. 7, the provision of positioning holes 11 and 12 in these printed circuit boards 1 and 10 facilitates precise positional adjustment of the land parts A—A, B—B—B, C—C—C, . . . and a—a, b—b—b, c—c—c, . . . of the first and second printed circuits in conjunction with positioning pins 20C1, 20C2, . . . which are provided on the jig 20A. The flux and gas foams contained in the cream solder 16 can escape during the soldering through a hole 13.

With the first and second printed circuit boards 1, 10 superimposed in this manner, they are held in position by the jig 20B. The jig 20B opens and closes by means of a hinge 20D. The first and second printed circuit boards 1, 10 can be brought into close contact with each other by means of a clamp 20E.

In many of the conventionally employed printed circuit boards, a protection cover is provided on the lands and conductors to prevent insulation and damage. In conditions where such printed circuit boards are to be used in accordance with the present invention, covers 1a and 10a are partially broken before they are used.

After the first and second printed circuit boards 1 and 10 have been fixed by the superimposing jig arrangement 20A and 20B, they are sent together with the jigs 20A and 20B to a soldering process, wherein: The corresponding lands A1 and a1, B1 and b1, . . . or the electric circuit element 8 and the lands B and E are connected to each other by means of the paste-like solder 16. After the soldering process, the first and second printed circuit boards 1, 10 are interconnected at the land parts A and a, B and b, C and c, . . . and secured to each other forming electric circuit assembly through cooling and washing processes.

In this specific embodiment the connection between the first and second printed circuit boards is effected between the corresponding land parts A and a, B and b, C and c, . . . . However, the invention is not limited to such an arrangement but the connection may be effected between conductors or between the land parts A and a, B and b, C and c, . . . and conductors.

Figure 8:
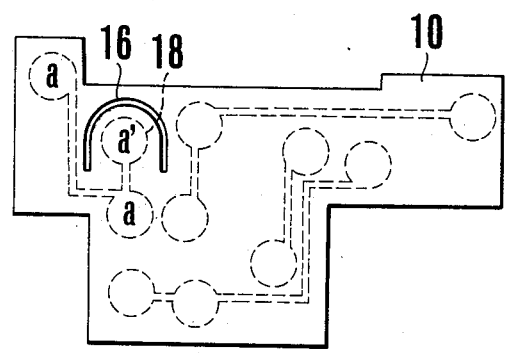
FIG. 8 is a plan view showing, by way of example, a printed circuit board which is modified with a terminal arrangement provided for checking the circuit operation.

An example of modification of the embodiment described above is shown in FIG. 8. In the embodiment described above, the first and second printed circuit boards 1, 10 are interconnected with corresponding land parts A and a, B and b, C and c, . . . interconnected in an opposed manner, as shown in FIG. 6. This arrangement does not permit a circuit operation check-up to be readily carried out. To solve this problem, the embodiment shown in FIG. 8 is provided with a check terminal a' arrangement. In FIG. 8, the check terminal a' is connected to the land part a1-a2 via a conductor. Around the check terminal a' is provided a cutout 16 which permits a portion of the printed circuit board 10 having the check terminal a' to fold. Therefore, the second printed circuit board 10 is preferably flexible.

Figure 9:
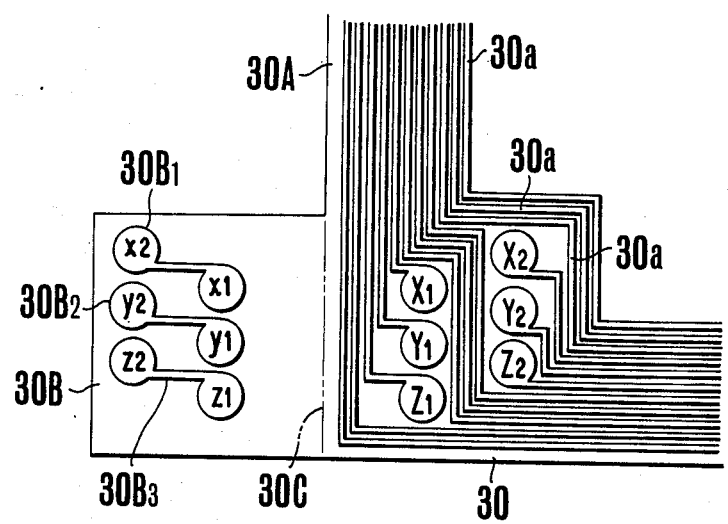
FIG. 9 is a plan view showing a printed circuit board in another embodiment of the invention.

Another embodiment of the invention is shown in FIG. 9. In this embodiment, the electric circuit land parts are interconnected as a single printed circuit board 30. Referring to FIG. 9, the printed circuit board 30 consists of a first printed circuit portion 30A and a second printed circuit board 30B. The first printed circuit portion 30A is provided with conductors 30a connecting circuit elements which are not shown and land parts X1, X2; Y1, Y2; Z1, Z2; . . . which interconnect the conductors 30a. The second printed circuit portion 30B is superimposable on the first printed circuit portion 30A by folding it along a two-dot chain line 30C. The second printed circuit part 30B is provided with conductive parts 30B1, 30B2, 30B3, . . . which respectively interconnect the land parts x1 and x2, the land parts y1 and y2 and the land parts z1 and z2 to each other.

Electric circuit elements are arranged on the first printed circuit board portion 30A of the printed circuit boards 30, which is arranged as described above. Then, the paste-like solder 16 is put on the land parts X, X; Y, Y; Z, Z; . . . . The second printed circuit board part 30B is then folded and superimposed on the first part 30A in such a manner that the land parts X1 and X2 are superimposed on land parts x1 and x2, the land parts Y1 and Y2 on land parts y1 and y2 and the land parts Z1 and Z2 on land parts z1 and z2 through the paste-like solder 16. The circuit board 30 is then sent to a soldering process in this folded and superimposed condition. Fixed connection is then respectively obtained between the land parts X1 and x1, Y1 and y1, and Z1 and z1.

In the embodiment shown in FIG. 9, the land parts to be interconnected with each other are arranged in a part of the first printed circuit portion 30A, on which electric circuit elements are to be disposed. Meanwhile, the second printed circuit portion 30B separately effects interconnection between the land parts A and a, B and b, C and c, . . . from circuit connection wires. This arrangment thus obviates the necessity of superimposing first and second printed circuit boards 1, 10 as in the other embodiment described in the foregoing.

It is a feature of the invention that the interconnection between the land parts A—A, B—B—B, C—C—C, . . . and a—a, b—b—b, c—c—c, . . . of the printed circuit boards 1, 10 can be effected without intercrossing conductors and without requiring use of through holes 11, 12. Furthermore, since commercially available printed circuit boards 1, 10 can be utilized (as in the case of the first embodiment), the object of the invention can be attained by minor modification of the manufacturing processes which have heretofore been carried out for conventional printed circuit boards. Therefore, the invention does not increase manufacturing costs.

As shown in FIG. 6, the conductive parts (the lands and conductors) of the superimposed printed circuit boards 1, 10 are opposed in the inward directions. Therefore, in accordance with the invention, an electrical short-circuit relative to the outside can be effectively prevented. Furthermore, since the sides facing the outside are substrates of the circuit boards 1, 10, the electric circuit elements, the land parts A—A, B—B—B, C—C—C, . . . and a—a, b—b—b, c—c—c, . . . and the conductors will never be damaged by moving members disposed nearby.

Furthermore, in the first and second embodiments, a circuit operation checking land is connected to the lands of one of the printed circuit boards 1, 10. Meanwhile, an opening may be provided in the other printed circuit board 1, 10 to allow a checking probe to be connected to the circuit operation checking land from outside. This arrangement simplifies structural arrangement.

What we claim:

1. An electric circuit assembly, comprising:
  (a) a first printed circuit board having a plurality of electric circuit forming elements, conductor patterns interconnecting said elements, and land parts connected to said conductor patterns, said land parts consisting of at least one pair of lands A1–A2 which are provided on one surface of said first printed circuit board;
  (b) a second printed circuit board, said second printed circuit board having at least one pair of lands a1–a2 interconnected through a conductor pattern, wherein said lands a1–a2 are located at positions on one surface of said second printed circuit board complementary to positions of the lands A1–A2 on the first printed circuit board, said second printed circuit board overlying said first printed circuit board bringing said surfaces thereon in contact with each other, wherein said lands a1–a2 are superimposed on said lands A1–A2; and
  (c) one of said first and second printed circuit boards being made of flexible material forming a flexible board, and provided with a check terminal connected to respective lands therein, said flexible board being cut out partly surrounding said check terminal so as to allow the check terminal to be folded outwardly.

* * * * *